(12) United States Patent
Chien et al.

(10) Patent No.: US 10,819,315 B1
(45) Date of Patent: Oct. 27, 2020

(54) VOLTAGE MODE SIGNAL TRANSMITTER

(71) Applicants: Global Unichip Corporation, Hsinchu (TW); Taiwan Semiconductor Manufacturing Co., Ltd., Hsinchu (TW)

(72) Inventors: Ting-Hsu Chien, Hsinchu (TW); Yen-Chung T. Chen, Hsinchu (TW); Cho-Ru Yang, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/809,558

(22) Filed: Mar. 5, 2020

(30) Foreign Application Priority Data

Dec. 26, 2019 (TW) .............................. 108147739 A

(51) Int. Cl.
*H03K 3/012* (2006.01)
*H03M 1/80* (2006.01)
*H03K 3/037* (2006.01)
*H03K 5/13* (2014.01)

(52) U.S. Cl.
CPC ............. *H03K 3/012* (2013.01); *H03K 3/037* (2013.01); *H03K 5/13* (2013.01); *H03M 1/808* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,225,929 | B1* | 5/2001 | Beck ..................... | H03M 1/808 341/144 |
| 9,397,677 | B1* | 7/2016 | Abramzon .......... | H03M 1/1033 |
| 9,407,278 | B1* | 8/2016 | Dempsey ................ | H03M 1/66 |
| 9,906,045 | B2* | 2/2018 | Kim ........................ | H02J 50/40 |
| 10,396,815 | B1* | 8/2019 | Kuttner ................. | H03F 3/2175 |
| 10,511,312 | B1* | 12/2019 | Pastorello ................. | G06F 1/10 |
| 2005/0249180 | A1* | 11/2005 | Murakami ........ | H04W 72/0453 370/343 |
| 2006/0187971 | A1* | 8/2006 | Lum ........................ | H04L 5/00 370/535 |
| 2009/0323563 | A1* | 12/2009 | Ho ........................ | H04L 1/0065 370/280 |
| 2012/0032741 | A1* | 2/2012 | De Maaijer ......... | H03F 3/45183 330/277 |
| 2012/0039401 | A1* | 2/2012 | D'Souza ............ | H03H 11/1291 375/259 |
| 2013/0002301 | A1* | 1/2013 | Gondi ................... | H04L 25/028 326/83 |

(Continued)

*Primary Examiner* — Adam D Houston
(74) *Attorney, Agent, or Firm* — JCIPRNET

(57) ABSTRACT

A voltage mode signal transmitter includes a front-end signal processor and a signal transformer. The front-end signal processor receives a first and second data signal, and delays and inverts the data signals to generate a third and fourth data signal. The front-end signal processor selects two of the first data signal to the fourth data signal to generate a plurality of signal pairs according to a first control signal. The signal transformer selects one data signal of each of the signal pairs to generate input voltages according to a second control signal, and generates an output voltage according to the input voltages. A working frequency of the first control signal is lower than a working frequency of the second control signal.

10 Claims, 4 Drawing Sheets

(56) References Cited

U.S. PATENT DOCUMENTS

| | | | |
|---|---|---|---|
| 2013/0051578 A1* | 2/2013 | Chu | H04B 1/123 |
| | | | 381/94.1 |
| 2013/0059554 A1* | 3/2013 | Ripley | H04B 1/1607 |
| | | | 455/127.1 |
| 2014/0073243 A1* | 3/2014 | Hijioka | H04B 5/0037 |
| | | | 455/41.1 |
| 2014/0120851 A1* | 5/2014 | Steele | H04B 1/1036 |
| | | | 455/90.2 |
| 2016/0005376 A1* | 1/2016 | Joo | H02M 3/33523 |
| | | | 345/212 |
| 2018/0084584 A1* | 3/2018 | Umehara | H04W 72/121 |
| 2018/0097447 A1* | 4/2018 | Iorio | H03K 17/687 |
| 2019/0199401 A1* | 6/2019 | Pandey | H04B 3/30 |
| 2020/0019526 A1* | 1/2020 | Wentroble | G06F 13/4282 |
| 2020/0186161 A1* | 6/2020 | Shi | H03M 1/0678 |
| 2020/0192544 A1* | 6/2020 | Chung | G06F 3/0443 |

\* cited by examiner

VOLTAGE MODE SIGNAL TRANSMITTER

CROSS-REFERENCE TO RELATED APPLICATION

This application claims the priority benefit of Taiwan application serial no. 108147739, filed on Dec. 26, 2019. The entirety of the above-mentioned patent application is hereby incorporated by reference herein and made a part of this specification.

BACKGROUND

Technical Field

The disclosure relates to a voltage mode signal transmitter, particularly to a voltage mode signal transmitter capable of improving a working speed.

Related Art

In a conventional voltage mode signal transmitter, for de-emphasis numerical control of input data, it is necessary to dispose a multiplexer to select a data signal and an inverted and delayed data signal. The above selection may be affected by working frequency of a received control signal and thus limited by working speed. In the application of a high-frequency voltage mode signal transmitter, the working efficiency is often lower than expected.

SUMMARY

The disclosure provides a voltage mode signal transmitter capable of improving a signal processing speed.

A voltage mode signal transmitter of the disclosure includes a front-end signal processor and a signal transformer. The front-end signal processor receives a first data signal, a second data signal, and a first control signal. The front-end signal processor delays and inverts the first data signal and the second data signal to generate a third data signal and a fourth data signal respectively. The front-end signal processor is controlled by the first control signal to generate a plurality of signal pairs, wherein each of the signal pairs includes two of the first data signal, the second data signal, the third data signal, and the fourth data signal. The signal transformer is coupled to the front-end signal processor. The signal transformer receives the signal pairs and is controlled by a second control signal to generate a plurality of input voltages, and generates an output voltage according to the input voltages. Each of the input voltages corresponds to one data signal in the signal pairs. A working frequency of the second control signal is higher than a working frequency of the first control signal.

Based on the above, in the disclosure, the front-end signal processor that works at a first frequency that is relatively low performs front-end processing on a data signal. The signal transformer that works at a second frequency that is relatively high generates the output voltage. In this way, the voltage mode signal transmitter of the disclosure effectively improves the generation of the output voltage and improves the working efficiency.

To make the above features and advantages of the disclosure more comprehensible, examples accompanied with drawings are described in detail as follows.

DESCRIPTION OF THE EMBODIMENTS

Figure 1:
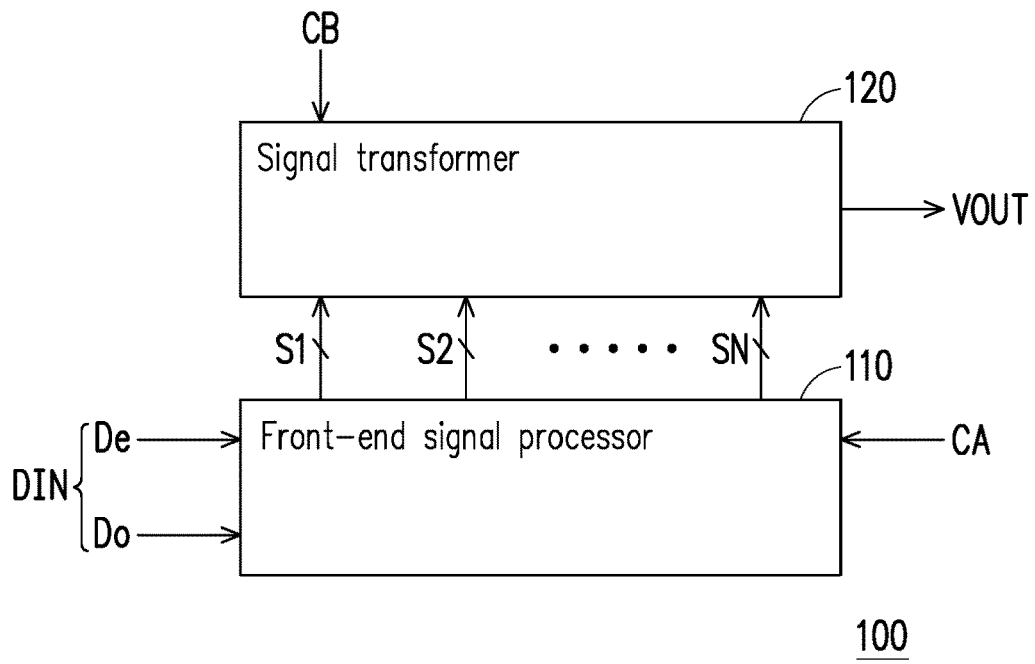
FIG. 1 illustrates a schematic diagram of a voltage mode signal transmitter according to an embodiment of the disclosure.

Referring to FIG. 1, FIG. 1 illustrates a schematic diagram of a voltage mode signal transmitter according to an embodiment of the disclosure. A voltage mode signal transmitter 100 includes a front-end signal processor 110 and a signal transformer 120. The front-end signal processor 110 is configured to receive a plurality of data signals DIN, wherein the data signals DIN include a plurality of first data signals De and a plurality of second data signals Do. The front-end signal processor 110 further delays and inverts the first data signals De and the second data signals Do, thereby generating a plurality of third data signals and a plurality of fourth data signals respectively. In addition, the front-end signal processor 110 receives a first control signal CA, and selects two of the first data signal De, the second data signal Do, the third data signal and the fourth data signal according to the first control signal CA to generate a plurality of signal pairs 51 to SN.

In addition, the signal transformer 120 is coupled to the front-end signal processor 110. The signal transformer 120 receives a second control signal CB and the signal pairs 51 to SN generated by the front-end signal processor 110. The signal transformer 120 selects either the first data signals or the second data signals in the signal pairs 51 to SN according to the second control signal CB to generate a plurality of input voltages, and directly generates an output voltage VOUT according to the input voltages.

It is noted that in the embodiment of the disclosure, a working frequency of the first control signal CA is at a first frequency and a working frequency of the second control signal CB is at a second frequency, wherein the second frequency is higher than the first frequency. That is, when the front-end signal processor 110 performs front-end processing on the data signals DIN, the front-end signal processor 110 works at a relatively low working speed; when the signal transformer 120 performs signal transformation on the signal pairs Si to SN that have undergone the front-end processing, the signal transformer 120 works at a relatively high working speed. In this way, the speed of the signal transformation performed by the signal transformer 120 can be effectively improved.

Figure 2:
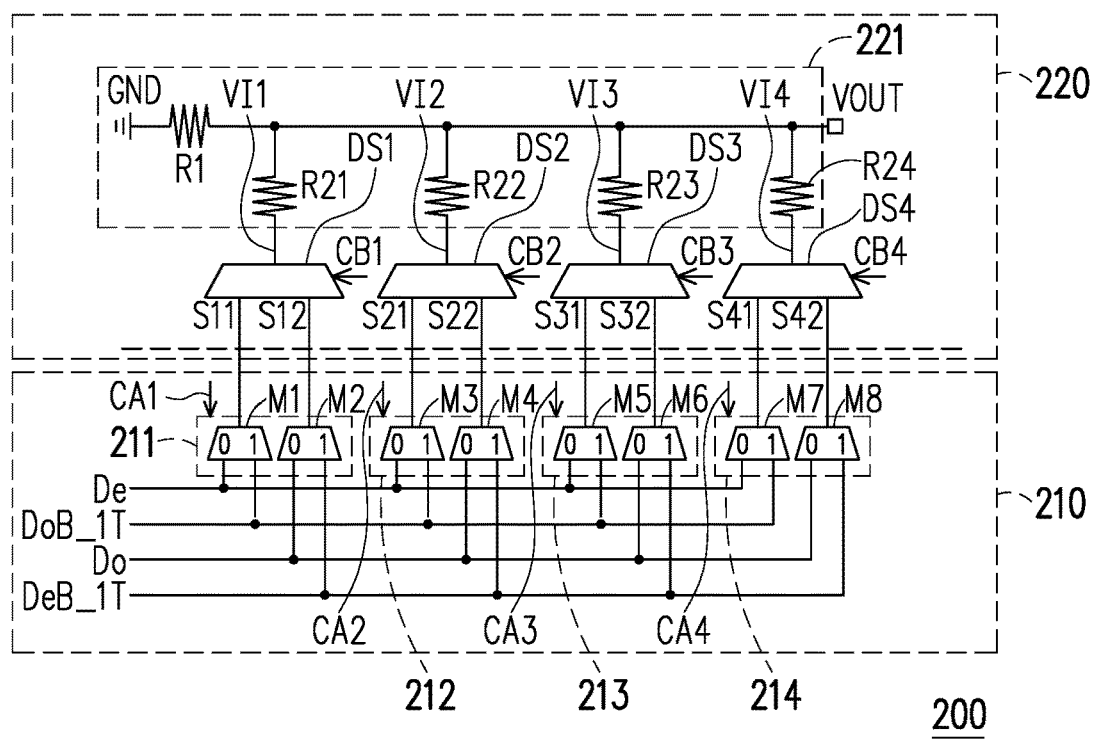
FIG. 2 illustrates a schematic circuit diagram of a voltage mode signal transmitter according to an embodiment of the disclosure.

In detail, FIG. 2 illustrates a schematic circuit diagram of a voltage mode signal transmitter according to an embodiment of the disclosure. A voltage mode signal transmitter 200 includes a front-end signal processor 210 and a signal transformer 220. The front-end signal processor 210 includes a plurality of multiplex circuit sets 211 to 214, and the multiplex circuit sets 211 to 214 include multiplexers M1 to M2, multiplexers M3 to M4, multiplexers M5 to M6, and multiplexers M7 to M8, respectively. In the embodiment of the disclosure, the multiplexers M1, M3, M5 and M7 receive the first data signal De and a fourth data signal DoB_1T. The multiplexers M2, M4, M6 and M8 receive the second data signal Do and a third data signal DeB_1T. The multiplex circuit sets 211 to 214 respectively receive a plurality of subsignals CA1 to CA4 of the first control signal. The multiplex circuit set 211 generates a signal S11 and a signal S12 according to the subsignal CA1; the multiplex circuit set 212 generates a signal S21 and a signal S22 according to the subsignal CA2; the multiplex circuit set 213 generates a signal S31 and a signal S32 according to the subsignal CA3; and the multiplex circuit set 214 generates a signal S41 and a signal S42 according to the subsignal CA4.

In detail, taking the multiplex circuit set 211 as an example, when the subsignal CA1 is at a logic level "0," the multiplexer M1 selects the first data signal De to generate the signal S11, and the multiplexer M2 selects the second data signal Do to generate the signal S12. The signal S11 and the signal S12 form a signal pair.

In this embodiment, the signal transformer 220 includes signal selectors DS1 to DS4 and a digital-to-analog converter circuit 221. The signal selectors DS1 to DS4 are respectively coupled to the multiplex circuit sets 211 to 214, and respectively receive a plurality of subsignals CB1 to CB4 of the second control signal. The signal selector DS1 receives the signal S11, the signal S12 and the subsignal CB1, and selects either the signal S11 or the signal S12 according to the subsignal CB1 to generate an input voltage VI1; the signal selector DS2 receives the signal S21, the signal S22 and the subsignal CB2, and selects either the signal S21 or the signal S22 according to the subsignal CB2 to generate an input voltage VI2; the signal selector DS3 receives the signal S31, the signal S32 and the subsignal CB3, and selects either the signal S31 or the signal S32 according to the subsignal CB3 to generate an input voltage VI3; and the signal selector DS4 receives the signal S41, the signal S42 and the subsignal CB4, and selects either the signal S41 or the signal S42 according to the subsignal CB4 to generate an input voltage VI4.

The digital-to-analog converter circuit 221 is coupled to the signal selectors DS1 to DS4 and receives the input voltages VI1 to VI4. In this embodiment, the digital-to-analog converter circuit 221 may have an R-2R stepped architecture. The digital-to-analog converter circuit 221 includes resistors R1 and R21 to R24. One terminal of the resistor R1 receives a reference voltage GND, and the other terminal of the resistor R1 is commonly coupled to a plurality of first terminals of the resistors R21 to R24. In addition, a plurality of second terminals of the resistors R21 to R24 respectively receive the input voltages VI1 to VI4. The digital-to-analog converter circuit 221 is configured to perform digital-to-analog conversion on the input voltages VI1 to VI4 and generate the output voltage VOUT.

In this embodiment, a resistor value of the resistor R1 may be the same as a resistor value of the resistor R21, and the resistor values of the resistors R21 to R24 may be sequentially arranged to form a geometric sequence with a common ratio of 2. The ratio between the resistor values of the resistors R21 to R24 may be 16:8:4:2.

It is noted that, in this embodiment, the multiplex circuit sets 211 to 214 in the front-end signal processor 210 perform the front-end processing on the data signals according to the subsignals CA1 to CA4 with a relatively low frequency. The signal selectors DS1 to DS4 in the signal transformer 220 perform the signal selection according to the subsignals CB1 to CB4 with a relatively high frequency. Moreover, the signal transformer 220 directly provides the generated input voltages VI1 to VI4 to the digital-to-analog converter circuit 221 to improve a signal transformation speed.

In the embodiment of the disclosure, a working frequency of the subsignals CB1 to CB4 of the second control signal may be twice a working frequency of the subsignals CA1 to CA4 of the first control signal. For example, a signal transmission rate corresponding to the subsignals CB1 to CB4 may be 32 Gb/s (32 gigabits per second), and a signal transmission rate corresponding to the subsignals CA1 to CA4 may be 16 Gb/s.

Additionally, in the embodiment of the disclosure, the numbers of the signal selectors DS1 to DS4 and the multiplex circuit sets 211 to 214 are for exemplary purposes only and are not limited to four. The numbers of the signal selector and the multiplex circuit set are not fixed and may be changed by a designer as the resolution of the signal transformer 220 changes.

Figure 3:
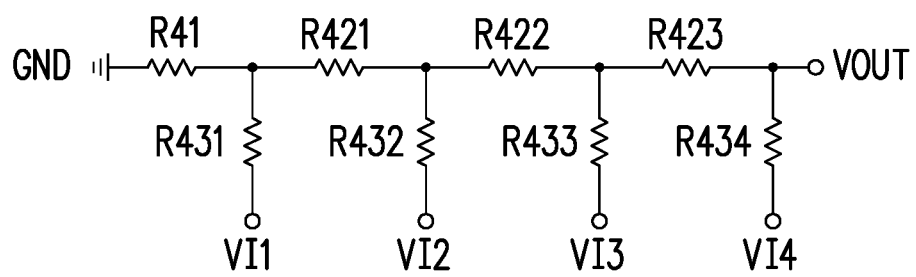
FIG. 3 illustrates a schematic diagram of another implementation of a digital-to-analog converter circuit in a signal transformer according to an embodiment of the disclosure.

Referring to FIG. 3, FIG. 3 illustrates a schematic diagram of another implementation of a digital-to-analog converter circuit in a signal transformer according to an embodiment of the disclosure. A digital-to-analog converter circuit 300 includes a plurality of resistors R41, R421 to R424, and R431 to R434. A first terminal of the resistor R41 receives the reference voltage GND, and the resistors R421 to R424 are sequentially connected in series between a second terminal of the resistor R41 and an output terminal of the digital-to-analog converter circuit 300. First terminals of the resistors R431 to R434 respectively receive the input voltages VI1 to VI4. A second terminal of the resistor R431 is coupled to the second terminal of the resistor R41. Second terminals of the resistors R432 to R434 are sequentially coupled to an endpoint where the resistor R421 and its adjacent resistor R422 are coupled, an endpoint where the resistor R422 and its adjacent resistor R423 are coupled, and an endpoint where the resistor R423 and its adjacent resistor are coupled. The output terminal of the digital-to-analog converter circuit 300 generates the output voltage VOUT.

In this embodiment, resistor values of the resistors R41 and R431 to R434 may be the same. Resistor values of the resistors R421 to R423 may also be the same. The resistor value of the resistor R41 may be twice the resistor value of the resistor R421. The digital-to-analog converter circuit 300 may be an R-2R stepped digital-to-analog converter circuit in another form.

The digital-to-analog converter circuit of the embodiment of the disclosure is not limited to the implementations shown in FIG. 2 and FIG. 3. Any digital-to-analog converter circuit known to those skilled in the art can be applied to the disclosure.

Figure 4A:
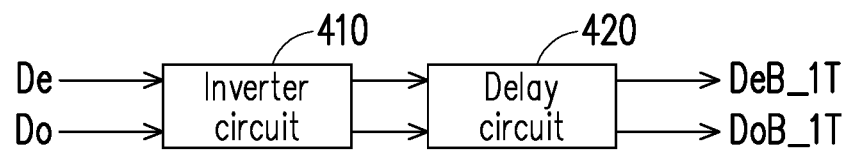
FIG. 4A and FIG. 4B illustrate schematic diagrams of an implementation of a delaying and inverting operation of a front-end signal processor according to an embodiment of the disclosure.
Figure 4B:
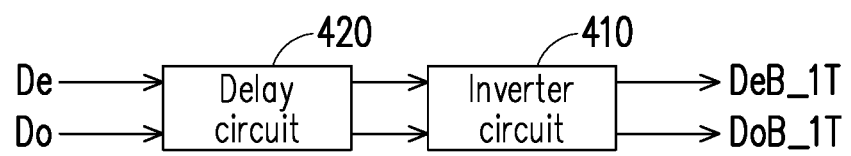

Referring to FIG. 4A and FIG. 4B, FIG. 4A and FIG. 4B illustrate schematic diagrams of an implementation of a delaying and inverting operation of a front-end signal processor according to an embodiment of the disclosure. In FIG. 3A, a front-end signal processor according to the embodiment of the disclosure may further include an inverter circuit 410 and a delay circuit 420. The inverter circuit 410 and the delay circuit 420 are coupled in series with each other, wherein the inverter circuit 410 receives the first data signal De and the second data signal Do, and performs an inverting operation on the first data signal De and the second data signal Do. The delay circuit 420 is coupled to an output terminal of the inverter circuit 410, and delays an output signal generated by the inverter circuit 410 to generate the third data signal DeB_1T and the fourth data signal DoB_1T.

In the embodiment of the disclosure, the coupling order of the inverter circuit 410 and the delay circuit 420 is not fixed. In FIG. 4B, the delay circuit 420 may be coupled before the inverter circuit 410, and may delay the first data signal De and the second data signal Do, and then perform the inverting operation to generate the same third data signal DeB_1T and fourth data signal DoB_1T.

Figure 5A:
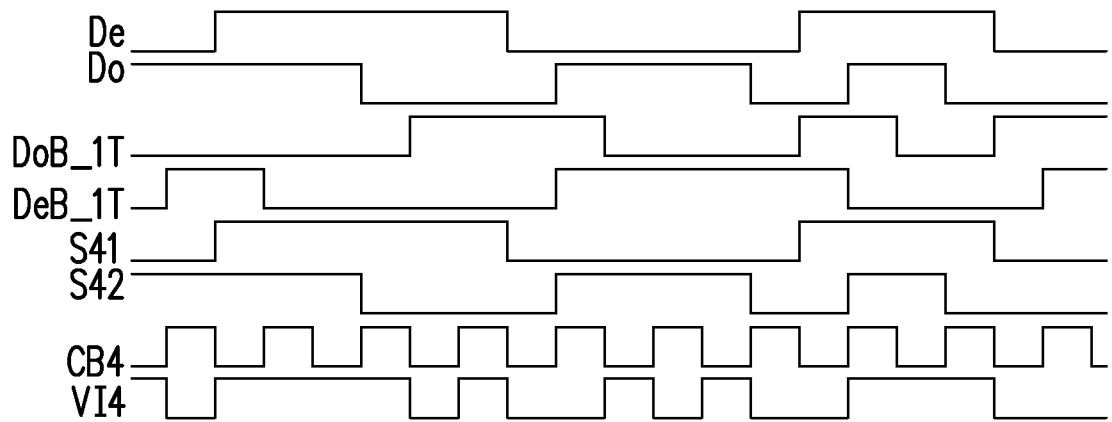
FIG. 5A to FIG. 5B illustrate operation waveform diagrams of a voltage mode signal transmitter according to an embodiment of the disclosure.
Figure 5B:
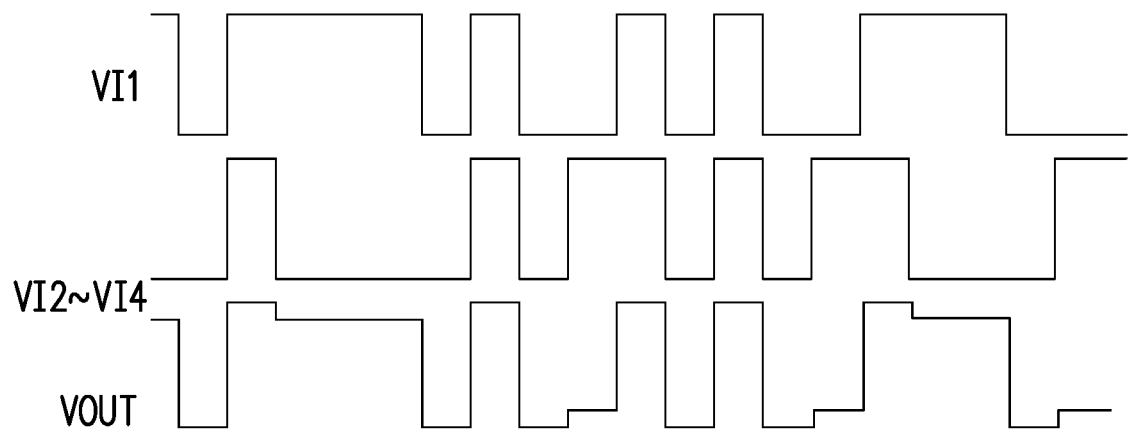

Referring to FIG. 2 and FIG. 5A to FIG. 5B together, FIG. 5A to FIG. 5B illustrate operation waveform diagrams of a voltage mode signal transmitter according to an embodiment of the disclosure. In FIG. 5A, the generation of the input voltage VI4 is described as an example. The first data signal De, the second data signal Do, the third data signal DeB_1T, and the fourth data signal DoB_1T may work at a relatively low working frequency. According to the subsignal CA4 of the first control signal, the multiplex circuit set 214 generates the signal S41 and signal S42. Since the subsignal CA4 works at the first frequency that is relatively low, the signal S41 and the signal S42 also work at the first frequency that is relatively low.

In addition, the subsignal CB4 of the second control signal works at the second frequency that is relatively high. According to the subsignal CB4, the signal selector DS4 selects either the signal S41 or the signal S42 to generate the input voltage VI4, and provides the input voltage VI4 to the digital-to-analog converter circuit 221. In FIG. 4A, when the subsignal CB4 is at the logic level "0," the signal selector DS4 selects the signal S42 to generate the input voltage VI4; in contrast, when the subsignal CB4 is at a logic level "1," the signal selector DS4 selects the signal S41 to generate the input voltage VI4.

Here, the input voltages VI1 to VI3 are generated similarly to the input voltage VI4, and a description thereof is omitted.

In FIG. 5B, the digital-to-analog converter circuit 221 receives the input voltages VI1 to VI4, and, according to the received input voltages VI1 to VI4, generates the output voltage VOUT through a resistor network composed of the resistors R1 and R21 to R24. Since the generation of the input voltages VI1 to VI4 is based on the second frequency that is relatively high, the digital-to-analog converter circuit 221 may increase the speed of the output voltage VOUT.

In summary, in the disclosure, the front-end signal processor performs the front-end processing on a data signal at the first frequency that is relatively low, and the signal transformer performs the signal transformation on the data signal at the second frequency that is relatively high. In this way, the signal transformation by the signal transformer can be performed at the second frequency that is relatively high throughout the circuit, and working efficiency of the voltage mode signal transmitter is effectively improved.

Although the disclosure has been described with reference to the above examples, it will be apparent to one of ordinary skill in the art that modifications to the described examples may be made without departing from the spirit of the disclosure. Accordingly, the scope of the disclosure will be defined by the attached claims and not by the above detailed descriptions.

What is claimed is:

1. A voltage mode signal transmitter, comprising:
a front-end signal processor receiving a first data signal, a second data signal, and a first control signal, the front-end signal processor delaying and inverting the first data signal and the second data signal to generate a third data signal and a fourth data signal respectively, the front-end signal processor being controlled by the first control signal to generate a plurality of signal pairs, wherein each of the plurality of signal pairs comprises two of the first data signal, the second data signal, the third data signal, and the fourth data signal; and
a signal transformer coupled to the front-end signal processor, the signal transformer receiving the plurality of signal pairs, and being controlled by a second control signal to generate a plurality of input voltages, and generating an output voltage according to the plurality of input voltages,
wherein each of the plurality of input voltages corresponds to one data signal in the plurality of signal pairs, and a working frequency of the second control signal is higher than a working frequency of the first control signal.

2. The voltage mode signal transmitter according to claim 1, wherein the front-end signal processor comprises:
a plurality of multiplex circuit sets, coupled to the signal transformer and controlled by the first control signal, each of the plurality of multiplex circuit sets comprising:
a first multiplexer, receiving the first data signal and the fourth data signal, and selecting whether to output the first data signal or the fourth data signal; and
a second multiplexer, receiving the second data signal and the third data signal, and selecting whether to output the second data signal or the third data signal.

3. The voltage mode signal transmitter according to claim 2, wherein the front-end signal processor further comprises:
a delay circuit; and
an inverter circuit coupled in series with the delay circuit, the delay circuit and the inverter circuit delaying and inverting the first data signal and the second data signal to generate the third data signal and the fourth data signal respectively.

4. The voltage mode signal transmitter according to claim 1, wherein the signal transformer comprises:
a plurality of signal selectors respectively controlled by the second control signal, and respectively selecting one of the data signals in the plurality of signal pairs to generate the plurality of input voltages; and
a digital-to-analog converter circuit performing digital-to-analog conversion on the plurality of input voltages to generate the output voltage.

5. The voltage mode signal transmitter according to claim 4, wherein the digital-to-analog converter circuit comprises:
a first resistor having a first terminal receiving a reference voltage; and
a plurality of second resistors having a first terminal commonly coupled to a second terminal of the first resistor, the plurality of second resistors respectively receiving the plurality of input voltages.

6. The voltage mode signal transmitter according to claim 5, wherein resistor values of the plurality of second resistors are sequentially arranged to form a geometric sequence with a common ratio of 2.

7. The voltage mode signal transmitter according to claim 4, wherein the digital-to-analog converter circuit comprises:
a first resistor having a first terminal receiving a reference voltage;
a plurality of second resistors connected in series between a second terminal of the first resistor and an output terminal of the digital-to-analog converter circuit; and
a plurality of third resistors, wherein first terminals of the plurality of third resistors respectively receive the plurality of input voltages, and second terminals of the plurality of third resistors are respectively coupled to the second terminal of the first resistor and an endpoint where two adjacent ones of the plurality of second resistors are coupled.

8. The voltage mode signal transmitter according to claim 7, wherein the first resistor has the same resistor value as each of the plurality of third resistors, the plurality of second resistors have the same resistor value, and the resistor value of the first resistor is equal to the resistor value of each of the plurality of second resistors.

9. The voltage mode signal transmitter according to claim 1, wherein the working frequency of the second control signal is twice the working frequency of the first control signal.

10. The voltage mode signal transmitter according to claim 9, wherein a signal transmission rate corresponding to the second control signal is 32 Gb/s, and a signal transmission rate corresponding to the first control signal is 16 Gb/s.

* * * * *